(12) United States Patent
Mukai et al.

(10) Patent No.: US 7,808,344 B2
(45) Date of Patent: Oct. 5, 2010

(54) BOUNDARY ACOUSTIC WAVE FILTER

(75) Inventors: Takao Mukai, Takatsuki (JP); Masaru Yata, Kanazawa (JP); Yasuhisa Fujii, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/354,162

(22) Filed: Jan. 15, 2009

(65) Prior Publication Data

US 2009/0115547 A1   May 7, 2009

Related U.S. Application Data

(63) Continuation of application No. PCT/JP2007/065193, filed on Aug. 2, 2007.

(30) Foreign Application Priority Data

Sep. 25, 2006  (JP) .............................. 2006-259022

(51) Int. Cl.
*H03H 9/64* (2006.01)

(52) U.S. Cl. ...................... 333/193; 333/195
(58) Field of Classification Search ................ 333/193, 333/195; 313/313 A
See application file for complete search history.

(56) References Cited

U.S. PATENT DOCUMENTS

| | | | |
|---|---|---|---|
| 5,585,684 A | | 12/1996 | Abe |
| 5,874,869 A | * | 2/1999 | Ueda et al. .................. 333/193 |
| 7,078,989 B2 | * | 7/2006 | Inoue et al. ................. 333/195 |
| 7,151,424 B2 | * | 12/2006 | Kando ........................ 333/193 |
| 7,339,304 B2 | * | 3/2008 | Kadota et al. ........... 310/313 A |
| 7,459,997 B2 | * | 12/2008 | Takamine ................... 333/195 |
| 7,471,027 B2 | * | 12/2008 | Kando ..................... 310/313 A |
| 2004/0070470 A1 | * | 4/2004 | Takamine ................... 333/195 |
| 2006/0181369 A1 | | 8/2006 | Shibahara |
| 2007/0126531 A1 | | 6/2007 | Yata |

FOREIGN PATENT DOCUMENTS

| | | |
|---|---|---|
| JP | 05-251988 A | 9/1993 |
| JP | 05-335881 A | 12/1993 |
| WO | 98/52279 A1 | 11/1998 |
| WO | WO 2004070946 A1 * | 8/2004 |
| WO | 2005/036744 A1 | 4/2005 |
| WO | WO 2005034347 A1 * | 4/2005 |
| WO | WO 2006087875 A1 * | 8/2006 |

OTHER PUBLICATIONS

Official Communication issued in International Patent Application No. PCT/JP2007/065193, mailed on Oct. 30, 2007.

* cited by examiner

*Primary Examiner*—Robert Pascal
*Assistant Examiner*—Alan Wong
(74) *Attorney, Agent, or Firm*—Keating & Bennett, LLP

(57) ABSTRACT

A longitudinally coupled resonator boundary acoustic wave filter device includes a piezoelectric substrate made of $LiNbO_3$ having a principal plane obtained by rotating the Y-axis through about 15 degrees +−10 degrees, a dielectric substrate made of silicon oxide and laminated on the piezoelectric substrate, and an electrode structure arranged at a boundary between the piezoelectric substrate and the dielectric substrate. The electrode structure includes a plurality of IDTs arranged in a direction in which a boundary acoustic wave propagates, and reflectors, wherein where in each of the plurality of IDTs, the overlap width of electrode fingers is W and the interval of electrode fingers is P, W/P is in a range of about 20 to about 45.

7 Claims, 9 Drawing Sheets

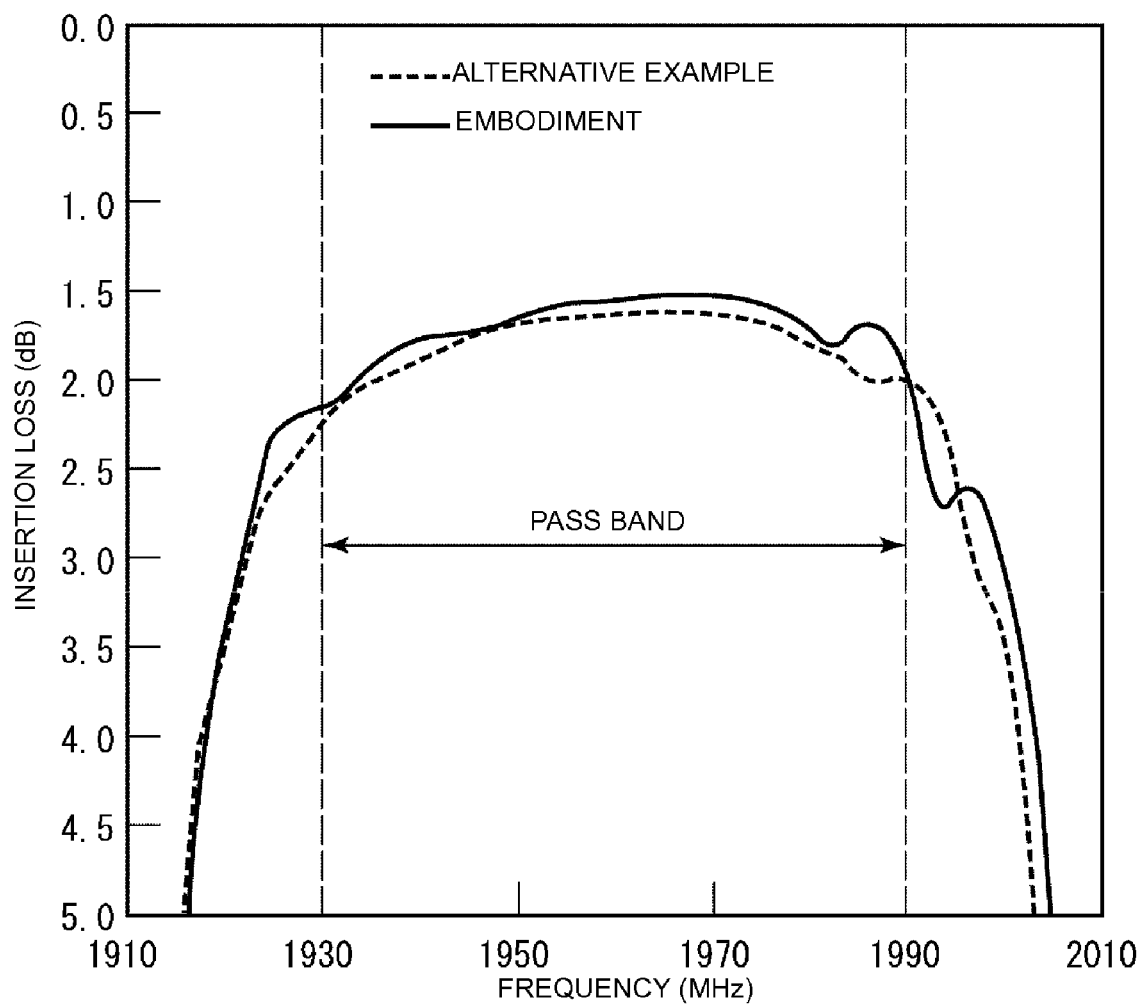

BOUNDARY ACOUSTIC WAVE FILTER

BACKGROUND OF THE INVENTION

1. Field of the Invention

The present invention relates to a boundary acoustic wave filter device used as, for example, a band-pass filter of a cellular phone, and, more particularly, to a longitudinally coupled resonator boundary acoustic wave filter device.

2. Description of the Related Art

Various surface acoustic wave filter devices are used as a band-pass filter in a cellular phone or other devices.

For example, Japanese Unexamined Patent Application Publication No. 5-335881 discloses a longitudinally coupled resonator surface acoustic wave filter device used for an application of this type. FIG. 10 is a schematic plan view showing a surface acoustic wave filter device described in Japanese Unexamined Patent Application Publication No. 5-335881. The surface acoustic wave filter device 1001 includes a piezoelectric substrate 1002 made of 36 degrees rotated Y-cut X-propagating $LiTaO_3$.

First and second longitudinally coupled resonator surface acoustic wave filter portions 1003 and 1004 are provided on the piezoelectric substrate 1002.

The first longitudinally coupled resonator surface acoustic wave filter portion 1003 includes a first interdigital transducer (IDT) 1020, and second and third IDTs 1030 and 1040. The first IDT 1020 is arranged between the second and third IDTs 1030 and 1040. The second and third IDTs 1030 and 1040 are arranged respectively on both sides of the first IDT 1020 in a surface acoustic wave propagating direction in which a surface acoustic wave propagates. Reflectors 1050 and 1060 are respectively arranged on both sides of the region in which the IDTs 1020 to 1040 are provided in the surface acoustic wave propagating direction. A first end of the middle first IDT 1020 is connected to an input terminal 1005, and a second end thereof is connected to a ground.

First ends of the IDTs 1030 and 1040 are connected to a ground, and second ends thereof are connected to one end of second and third IDTs 1031 and 1041 of the second longitudinally coupled resonator surface acoustic wave filter portion 1004.

The second ends of the IDTs 1031 and 1041 are connected to a ground.

The second longitudinally coupled resonator surface acoustic wave filter portion 1004 is also a three-IDT type longitudinally coupled resonator surface acoustic wave filter portion, and includes a first IDT 1021 between the second and third IDTs 1031 and 1041. A first end of the IDT 1021 is connected to a ground, and a second end thereof is connected to an output terminal 1006. Reflectors 1051 and 1061 are respectively arranged on both sides of the portion in which the IDTs 1021 to 1041 are provided.

In the longitudinally coupled resonator surface acoustic wave filter device 1001, where the overlap width of the electrode fingers of each of the IDTs 1020 to 1040 and 1021 to 1041 is W, and the pitch of the electrode fingers is P, the ratio W/P is in the range from 15 to 90. That is, FIG. 11 shows that, as the ratio W/P increases, an insertion loss tends to increase irrespective of a center frequency. In addition, when the ratio W/P is less than 15, an insertion loss abruptly increases irrespective of a center frequency. Japanese Unexamined Patent Application Publication No. 5-335881 describes that an insertion loss may be reduced by setting the lower limit of the ratio W/P to 15 and the upper limit of the ratio W/P to 90. Then, by setting W/P in the range of 15 to 90, insertion losses in the center frequencies may be less than or equal to 3 dB.

On the other hand, WO98/52279 describes a one-port boundary acoustic wave resonator that is arranged so that an electrode having IDTs is provided at a boundary between a piezoelectric substrate made of 36 degrees rotated Y-cut X-propagating $LiTaO_3$ and an $SiO_2$ film. In the description of FIG. 4 of WO98/52279, a configuration in which the aperture length of the IDT is 15λ and the interval λ of the electrode fingers of the IDT is 4 μm in the one-port boundary acoustic wave resonator is described. Note that the aperture length corresponds to a value obtained by adding the overlap width of electrode fingers of the IDT and the sum of the gap lengths between the overlap portion and the bus bars.

As described above, Japanese Unexamined Patent Application Publication No. 5-335881 describes that in a longitudinally coupled resonator surface acoustic wave filter device that utilizes a 36 degrees rotated Y-cut X-propagating $LiTaO_3$ substrate, when the ratio W/P ranges from 15 to 90, an insertion loss may be reduced.

On the other hand, in a band-pass filter used in an RF stage of a cellular phone, a low loss is highly required. For example, when used as an RX band-pass filter in the GSM 800 MHz band or the GSM 1900 MHz band, an insertion loss of the pass band must be 2.5 dB or less. Thus, a filter device needs to be designed to satisfy such low-loss requirement. However, design parameters and values that achieve such a low loss are different between a surface acoustic wave filter device and a boundary acoustic wave filter device. Thus, even when the results of the surface acoustic wave filter device described in Japanese Unexamined Patent Application Publication No. 5-335881 are applied directly to the boundary acoustic wave filter device, an insertion loss may not be 2.5 dB or less.

On the other hand, WO98/52279 describes that in a boundary acoustic wave filter device that utilizes a 36 degrees rotated Y-cut X-propagating $LiTaO_3$ substrate, when the aperture length is set to 15λ, a favorable characteristic may be obtained.

The inventors of the present invention studied the disclosure of the above-described related references and discovered that in a longitudinally coupled resonator boundary acoustic wave filter device that utilizes a piezoelectric substrate made of $LiNbO_3$ having a principal plane obtained by rotating the Y-axis through 15 degrees +−10 degrees, the aperture length is set to 15λ. However, lateral leakage increases and a reduced insertion loss cannot be achieved.

SUMMARY OF THE INVENTION

To overcome the problems described above, preferred embodiments of the present invention provide a longitudinally coupled resonator boundary acoustic wave filter device that utilizes a $LiNbO_3$ substrate having a principal plane obtained by rotating the Y-axis through about 15 degrees +−10 degrees and that is capable of sufficiently reducing an insertion loss.

According to a first preferred embodiment of the present invention, a boundary acoustic wave filter device includes a piezoelectric substrate made of $LiNbO_3$ having a principal plane obtained by rotating the Y-axis through about 15 degrees +−10 degrees, a dielectric substrate made of silicon oxide and laminated on the piezoelectric substrate, and an electrode structure arranged at a boundary between the piezoelectric substrate and the dielectric substrate, wherein the boundary acoustic wave filter device utilizes a boundary acoustic wave that propagates along the boundary, the electrode structure defines a longitudinally coupled resonator boundary acoustic wave filter portion that includes a plurality of IDTs arranged in a boundary acoustic wave propagating direction in which the boundary acoustic wave propagates, and a pair of reflectors arranged respectively on both sides of a region in which the plurality of IDTs are provided in the boundary acoustic wave propagating direction, and in each of the plurality of IDTs, the overlap width of electrode fingers is W and the interval of electrode fingers is P, and a ratio W/P is in a range of about 20 to about 45.

According to a second preferred embodiment of the present invention, a boundary acoustic wave filter device includes a piezoelectric substrate made of $LiNbO_3$ having a principal plane obtained by rotating the Y-axis through about 15 degrees +−10 degrees, and a dielectric substrate made of silicon oxide and laminated on the piezoelectric substrate, wherein an electrode structure defines N longitudinally coupled resonator boundary acoustic wave filter portions, where N is an integer greater than or equal to 3, each of which includes three IDTs arranged in a boundary acoustic wave propagating direction in which the boundary acoustic wave propagates, and a pair of reflectors arranged respectively on both sides of a region in which the three IDTs are provided in the boundary acoustic wave propagating direction, and the electrode structure further includes an input terminal and an output terminal, input ends of the N longitudinally coupled resonator boundary acoustic wave filter portions are connected to the input terminal, and in each of the IDTs, the overlap width of electrode fingers is W and the interval of electrode fingers is about P, and a ratio W/P is in a range of about 20 to about 45.

According to a third preferred embodiment of the present invention, a boundary acoustic wave filter device includes a piezoelectric substrate made of $LiNbO_3$ having a principal plane obtained by rotating the Y-axis through about 15 degrees +−10 degrees, a dielectric substrate made of silicon oxide and laminated on the piezoelectric substrate, and an electrode structure arranged at a boundary between the piezoelectric substrate and the dielectric substrate, wherein the boundary acoustic wave filter device utilizes a boundary acoustic wave that propagates along the boundary, the electrode structure defines first to sixth longitudinally coupled resonator boundary acoustic wave filter portions, each of which includes first to third IDTs arranged in the boundary acoustic wave propagating direction in which the boundary acoustic wave propagates, wherein the electrode structure includes an unbalanced terminal to which input ends of the first to sixth longitudinally coupled resonator boundary acoustic wave filter portions are connected, a first balanced terminal to which output ends of the first to third longitudinally coupled resonator boundary acoustic wave filter portions are connected, and a second balanced terminal to which output ends of the fourth to sixth longitudinally coupled resonator boundary acoustic wave filter portions are connected, the phase of an output signal to an input signal is substantially the same in each of the first to third longitudinally coupled resonator boundary acoustic wave filter portion, and the phase of an output signal to an input signal is substantially the same in each of the fourth to sixth longitudinally coupled resonator boundary acoustic wave filter portion, the phase of an output signal to an input signal in each of the first to third longitudinally coupled resonator boundary acoustic wave filter portions is different by about 180 degrees from the phase of an output signal to an input signal in each of the fourth to sixth longitudinally coupled resonator boundary acoustic wave filter portions, and in each of the IDTs, the overlap width of electrode fingers is W and the interval of electrode fingers is P, a ratio W/P is in a range of about 20 to about 45.

In the first to third preferred embodiments, preferably, the ratio W/P is in a range of about $22 \leqq W/P \leqq$ about 32. With this configuration, it is possible to further reduce an insertion loss.

Preferably, each IDT is made of a metal thin film, the metallization ratio of each IDT is about 0.45 or below, and where the density of the metal thin film is $\rho$ ($g/cm^3$), the thickness of an electrode is h ($\mu m$) and the interval of electrode fingers is P ($\mu m$), $\rho \times h/P \geqq$ about 1.2 ($g/cm^3$) is satisfied. In this case, it is possible to further reduce an insertion loss.

In the boundary acoustic wave filter device according to the first preferred embodiment, an electrode structure that defines a longitudinally coupled resonator boundary acoustic wave filter portion is provided at a boundary between a piezoelectric substrate made of $LiNbO_3$ having a principal plane obtained by rotating the Y-axis through about 15 degrees +−10 degrees and a dielectric substrate made of $SiO_2$, and in the IDTs of the electrode structure, the ratio W/P ranges from about 20 to about 45. Thus, it is possible to reduce an insertion loss within the pass band.

Similarly, in the second preferred embodiment, N (N is an integer greater than or equal to 3) longitudinally coupled resonator boundary acoustic wave filter portions are provided at a boundary between a piezoelectric substrate made of $LiNbO_3$ having a principal plane obtained by rotating the Y-axis through about 15 degrees +−10 degrees and a dielectric substrate made of $SiO_2$, and in the IDTs of each of the longitudinally coupled resonator boundary acoustic wave filter portions, W/P ranges from about 20 to about 45. Thus, it is possible to reduce an insertion loss. In addition, because input ends of the N longitudinally coupled resonator boundary acoustic wave filter portions are connected to a signal input terminal, the power withstanding capability is improved.

In the third preferred embodiment, an electrode structure that defines first to sixth longitudinally coupled resonator boundary acoustic wave filter portions is provided at a boundary between a piezoelectric substrate made of $LiNbO_3$ having a principal plane obtained by rotating the Y-axis through about 15 degrees +−10 degrees and a dielectric substrate made of $SiO_2$, and in the IDTs of these longitudinally coupled resonator boundary acoustic wave filter portions, W/P ranges from about 20 to about 45. Thus, it is possible to reduce an insertion loss.

In addition, in the third preferred embodiment, the input ends of the first to sixth longitudinally coupled resonator boundary acoustic wave filter portions are connected to the unbalanced terminal, the output ends of the first to third longitudinally coupled resonator boundary acoustic wave filter portions are connected to the first balanced terminal, and the output ends of the fourth to sixth longitudinally coupled resonator boundary acoustic wave filter portions are connected to the second balanced terminal. Thus, it is possible to provide a boundary acoustic wave filter device having a balance-unbalance converter function.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 5 is a view that shows the filter characteristic of a boundary acoustic wave filter device of a preferred embodiment having a three-element parallel structure and the filter characteristic of a boundary acoustic wave filter device of a preferred embodiment having a two-element parallel structure.

DETAILED DESCRIPTION OF PREFERRED EMBODIMENTS

Hereinafter, preferred embodiments of the present invention will be described with reference to the accompanying drawings.

Figure 1:
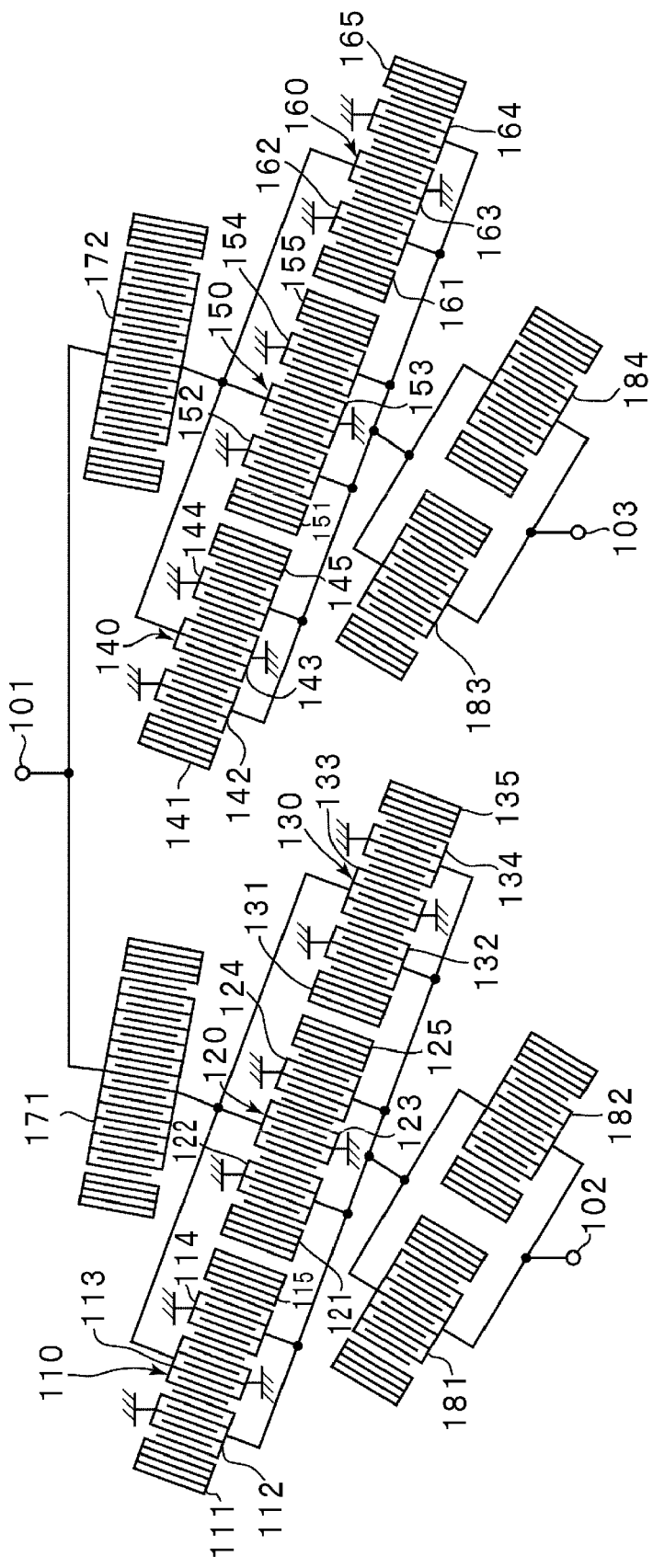
FIG. 1 is a schematic plan view that shows the electrode structure of a boundary acoustic wave filter device according to a first preferred embodiment of the present invention.
Figure 2:
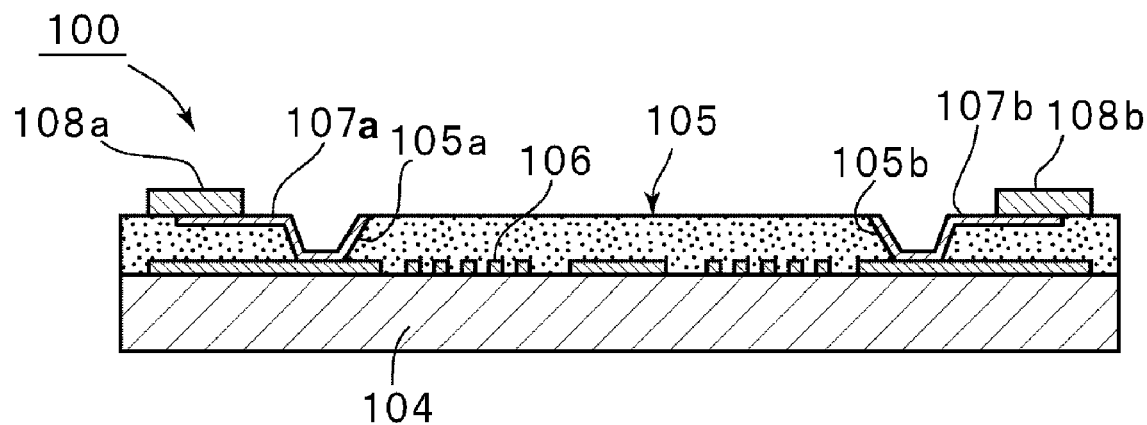
FIG. 2 is a schematic front cross-sectional view of the boundary acoustic wave filter device according to the first preferred embodiment of the present invention.

FIG. 1 is a schematic plan view that shows the electrode structure of a boundary acoustic wave filter device according to a first embodiment preferred of the present invention. FIG. 2 is a schematic front cross-sectional view of the boundary acoustic wave filter device according to the first preferred embodiment of the present invention.

The boundary acoustic wave filter device 100 of the present preferred embodiment is a band-pass filter of a receiving band of GSM 1900 MHz. A receiving side band-pass filter used in an RF stage of the cellular phone has a pass band of about 1930 MHz to about 1990 MHz. An insertion loss of about 2.5 dB or less is required within the pass band.

The boundary acoustic wave filter device 100 includes a piezoelectric substrate made of $LiNbO_3$ having a principal plane obtained by rotating the Y-axis through about 15 degrees +–10 degrees. That is, the piezoelectric substrate defined by Euler angles ($\phi$, $\theta$, $\psi$) equal to $\phi=0$ degrees and $\theta=105$ degrees +–10 degrees is used.

An $SiO_2$ film is laminated on the piezoelectric substrate to thereby define a longitudinally coupled resonator boundary acoustic wave filter device that uses an SH-type boundary acoustic wave propagating along a boundary between the piezoelectric substrate and the $SiO_2$ film.

More specifically, as shown in FIG. 1, the electrode structure is arranged between an unbalanced terminal 101 and first and second balanced terminals 102 and 103.

As shown in FIG. 2, in the boundary acoustic wave filter device 100, an $SiO_2$ film 105 is provided on the piezoelectric substrate 104. Then, the electrode structure 106 is provided at a boundary therebetween. In addition, openings 105a and 105b are provided in the $SiO_2$ film 105. Portions that are electrically connected to the outside of the electrode structure 106 are exposed through the openings 105a and 105b. Conductive patterns 107a and 107b are provided in the openings 105a and 105b. The conductive patterns 107a and 107b are electrically connected to the electrode structure 106 in the openings and extend outside of the openings 105a and 105b, respectively. Then, external electrodes 108a and 108b are provided on the upper surface of the $SiO_2$ film 105. The external electrodes 108a and 108b are electrically connected to the conductive patterns 107a and 107b, respectively. The external electrodes 108a and 108b correspond to the above-described unbalanced terminal 101, first and second balanced terminals 102 and 103, and portions connected to a ground, which will be described later.

Note that in the present preferred embodiment, the dielectric substrate is preferably made of the $SiO_2$ film 105. However, the dielectric substrate may be made of silicon oxide other than $SiO_2$.

The electrode structure shown in FIG. 1 is provided as the electrode structure 106. That is, input ends of first to third longitudinally coupled resonator boundary acoustic wave filter portions 110, 120 and 130 are connected in common to the unbalanced terminal 101. The first to third longitudinally coupled resonator boundary acoustic wave filter portions 110 to 130 are each a three-IDT type longitudinally coupled resonator boundary acoustic wave filter portion, and respectively include first IDTs 113, 123 and 133, arranged in the middle, and second IDTs 112, 122 and 132 and third IDTs 114, 124 and 134, arranged on both side of the first IDTs 113, 123 and 133 in a boundary acoustic wave propagating direction in which a boundary acoustic wave propagates. In addition, the longitudinally coupled resonator boundary acoustic wave filter portions 110, 120 and 130 respectively include pairs of reflectors 111 and 115, 121 and 125, and 131 and 135, which are arranged respectively on both sides of the regions in which three IDTs are provided in the boundary acoustic wave propagating direction.

One end of each of the first IDTs 113, 123 and 133 of the first to third longitudinally coupled resonator boundary acoustic wave filter portions is connected in common to the unbalanced terminal 101 via a one-port boundary acoustic wave resonator 171. The one-port boundary acoustic wave resonator 171 includes an IDT and reflectors arranged respectively on both sides of the IDT in the boundary wave propagating direction.

One end of each of the second IDTs 112, 122 and 132 and third IDTs 114, 124 and 134 of the first to third longitudinally coupled resonator boundary acoustic wave filter portions 110, 120 and 130 is connected to a ground, and the other ends are connected in common to a first balanced terminal 102 via one-port boundary acoustic wave resonators 181 and 182. The one-port boundary acoustic wave resonators 181 and 182 each include an IDT and reflectors arranged respectively on both sides of the IDT in the boundary wave propagating direction. Here, the one-port boundary acoustic wave resonator 181 and the one-port boundary acoustic wave resonator 182 are preferably connected in parallel with each other.

Among the first to third longitudinally coupled resonator boundary acoustic wave filter portions, the phase of an output signal to an input signal is substantially the same.

On the other hand, input ends of fourth to sixth longitudinally coupled resonator boundary acoustic wave filter portions 140, 150 and 160 are connected in common to the unbalanced terminal 101 via a one-port boundary acoustic wave resonator 172. The one-port boundary acoustic wave resonator 172 is similar to the one-port boundary acoustic wave resonator 171. In addition, the fourth to sixth longitudinally coupled resonator boundary acoustic wave filter portions 140 to 160 respectively include first IDTs 143, 153 and 163, second and third IDTs 142, 144, 152, 154, 162 and 164, arranged on both sides of the first IDTs, and reflectors 141, 145, 151, 155, 161, and 165.

Among the fourth to sixth longitudinally coupled resonator boundary acoustic wave filter portions, the phase of an output signal to an input signal is substantially the same.

However, the phase of an output signal to an input signal in each of the fourth to sixth longitudinally coupled resonator boundary acoustic wave filter portions is different by about 180 degrees from the phase of an output signal to an input signal in each of the first to third longitudinally coupled resonator boundary acoustic wave filter portions 110, 120 and 130. To obtain the above phase relationship, the polarity of each of the first IDTs 143, 153 and 163 of the fourth to sixth longitudinally coupled resonator boundary acoustic wave filter portions 140 to 160 is inverted with respect to the polarity of each of the first IDTs 113, 123 and 133 of the first to third longitudinally coupled resonator boundary acoustic wave filter portions 110, 120 and 130. Other than the above-described phases, the fourth to sixth longitudinally coupled resonator boundary acoustic wave filter portions 140 to 160 are similarly to the first to third longitudinally coupled resonator boundary acoustic wave filter portions 110 to 130.

One end of each of the second and third IDTs 142, 144, 152, 154, 162 and 164 of the fourth to sixth longitudinally coupled resonator boundary acoustic wave filter portions 140 to 160 connected to a ground, and the other ends are connected in common to a second balanced terminal 103 via boundary acoustic wave resonators 183 and 184. The one-port boundary acoustic wave resonators 183 and 184 are connected in parallel with each other.

In the longitudinally coupled resonator boundary acoustic wave filter device 100 of the present preferred embodiment, as described above, the first to third longitudinally coupled resonator boundary acoustic wave filter portions 110 to 130 are connected in common between the unbalanced terminal 101 and the first balanced terminal 102, and the fourth to sixth longitudinally coupled resonator boundary acoustic wave filter portions 140 to 160 are connected in common between the unbalanced terminal 101 and the second balanced terminal 103, to thereby define a filter device having a balance-unbalance converter function. Because the first to sixth longitudinally coupled resonator boundary acoustic wave filter portions 110 to 160 are connected in parallel and connected to the unbalanced terminal 101, it is possible to improve power withstanding capability.

Note that in the present preferred embodiment, the boundary acoustic wave propagating direction in the first to sixth longitudinally coupled resonator boundary acoustic wave filter portions 110 to 160 is ψ=about 20°, the boundary acoustic wave propagating direction in the boundary acoustic wave resonators 171 and 172 is ψ=about 10°, and the boundary acoustic wave propagating direction in the boundary acoustic wave resonators 181 to 184 is ψ=about 30°. That is, by varying these boundary acoustic wave propagating directions, the electromechanical coupling factor of each element is set to an appropriate value. Thus, it is possible to obtain improved characteristics.

However, the boundary wave propagating direction of each of the longitudinally coupled resonator boundary acoustic wave filter portions 110 to 160 may be set to be in substantially the same direction as the boundary wave propagating direction of each of the boundary acoustic wave resonators 171, 172, 181 to 184.

The longitudinally coupled resonator boundary acoustic wave filter device 100 of the present preferred embodiment has a feature such that in the first to sixth longitudinally coupled resonator boundary acoustic wave filter portions 110 to 160, where the overlap width of the electrode fingers of each IDT is W and the interval of the electrode fingers is P, the ratio W/P ranges from about 20 to about 45, and more preferably, from about 22 to about 32. By so doing, it is possible to remarkably reduce an insertion loss. This will be more specifically described.

The longitudinally coupled resonator boundary acoustic wave filter devices 100 of the present preferred embodiment having different ratios W/P were manufactured. In this case, the LiNbO$_3$ substrate was preferably made using LiNbO$_3$ having a principal plane obtained by rotating the Y-axis through about 15 degrees, and the SiO$_2$ film 105 preferably had a thickness of about 10 μm, for example. In addition, the electrode structure preferably used a metal layer made of Au, for example, and the metal layer preferably had a thickness of about 0.05 P, for example.

Three boundary acoustic wave filter devices were formed so that, in the longitudinally coupled resonator boundary acoustic wave filter portions 110 to 160, the metallization ratio of each IDT was about 0.4, W/Ps were respectively about 18.8, about 25.0, and about 37.5, for example. Note that the interval of the electrode fingers of the boundary acoustic wave resonator 172 was varied by about 0.004 μm, for example, from the interval of the electrode fingers of the boundary acoustic wave resonator 171 to thereby improve balancing.

Figure 3:
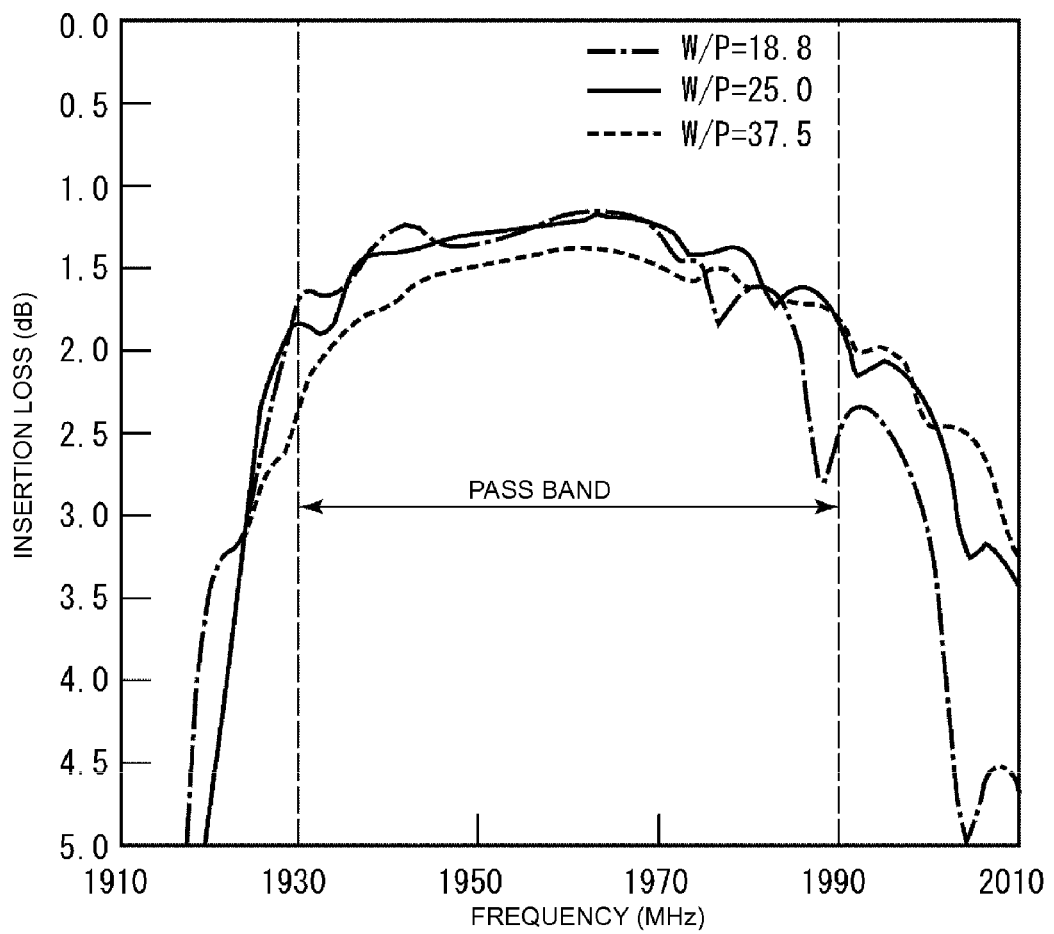
FIG. 3 is a view that shows a variation in filter characteristic when the ratio W/P is varied in the boundary acoustic wave filter device of the first preferred embodiment of the present invention.

FIG. 3 is a view that shows the filter characteristics of the three boundary acoustic wave filter devices manufactured as described above. As shown in FIG. 3, when the ratio W/P is about 18.8, a large ripple occurred around 1988 MHz, and an insertion loss is relatively large at about 2.9 dB. In addition, a relatively large ripple occurred around 1974 MHz.

In contrast, when W/P is about 25.0 or about 37.5, a maximum insertion loss is about 2.5 dB or less within the pass band, that is, in the frequency range of about 1930 MHz to about 1990 MHz. Thus, FIG. 3 shows that when the overlap width W/P is greater than or equal to about 25, an insertion loss within the pass band may be significantly reduced.

Next, in the boundary acoustic wave filter device of this preferred embodiment, the ratio W/P was changed, and an insertion loss within the pass band was measured in the above described manner. The results are shown in FIG. 4.

Figure 4:
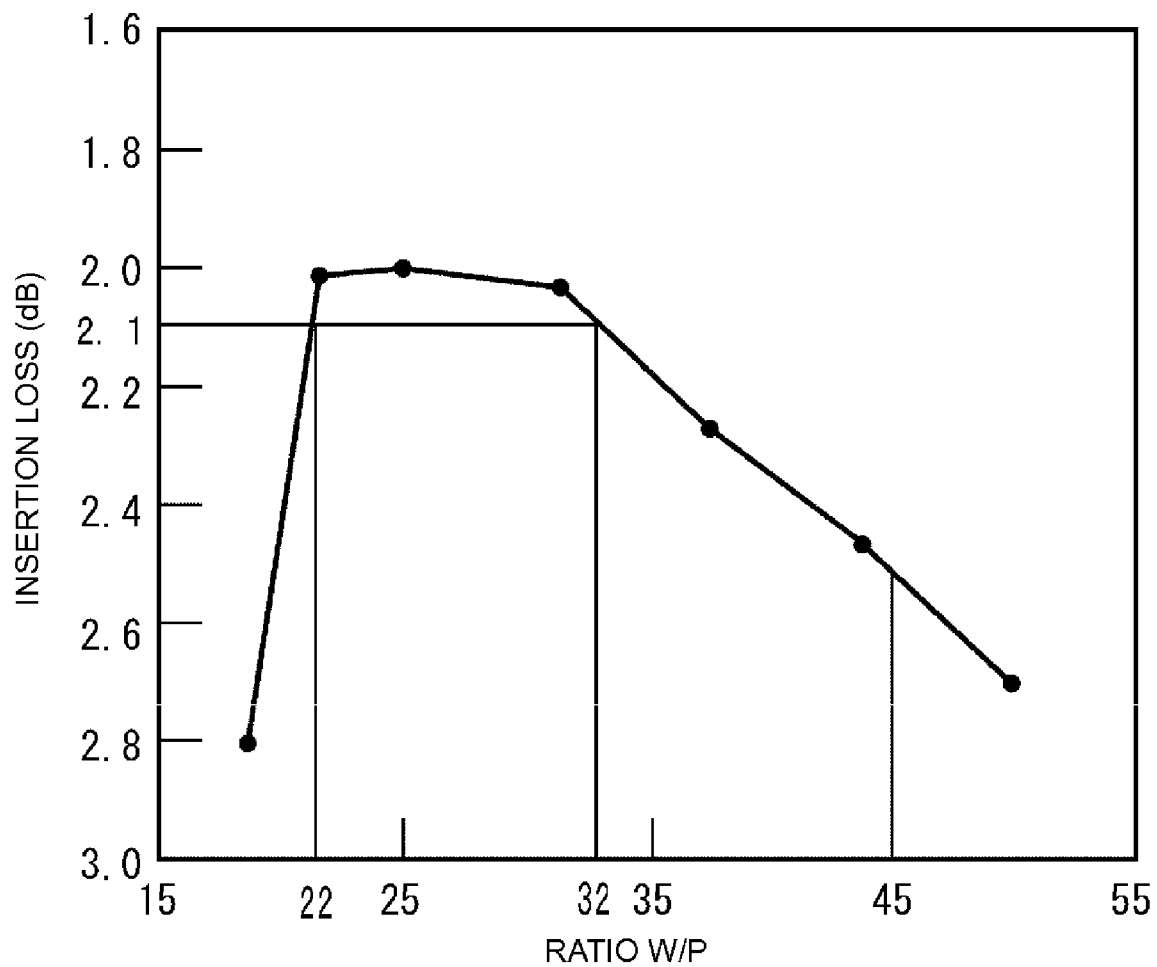
FIG. 4 is a view that shows the relationship between a ratio W/P and an insertion loss.

As shown in FIG. 4, when the ratio W/P ranges from about 20 to about 45, an insertion loss within the pass band may be about 2.5 dB or less. Thus, the ratio W/P is preferably in a range from about 20 to about 45. In addition, FIG. 4 shows that, more preferably, when the ratio W/P ranges from about 22 to about 32, an insertion loss may be further reduced to about 2.1 dB or less. Thus, the ratio W/P more preferably ranges from about 22 to about 32.

In the first preferred embodiment, the total number of pairs of electrode fingers in each of the first to third IDTs ranges from about 20 pairs to about 40 pairs. When the total number of pairs of electrode fingers of each of a plurality of IDTs in each longitudinally coupled resonator boundary acoustic wave filter portion is relatively small and ranges from about 20 pairs to about 40 pairs, the above-described lateral leakage tends to increase. Thus, when the total number of pairs of electrode fingers of a plurality of IDTs is relatively small in the boundary acoustic wave filter device, advantageous effects obtained by reducing an insertion loss due to W/P ranging from about 20 to about 45 is relatively large.

Note that in the boundary acoustic wave filter device 100 of the present preferred embodiment shown in FIG. 1, the first to third longitudinally coupled resonator boundary acoustic wave filter portions 110 to 130, that is, three longitudinally coupled resonator boundary acoustic wave filter portions, are connected in parallel between the unbalanced terminal 101 and the first balanced terminal 102, and similarly, three longitudinally coupled resonator boundary acoustic wave filter portions 140 to 160 are connected between the unbalanced terminal 101 and the second balanced terminal 103.

However, the present invention is not limited to the structure in which the three longitudinally coupled resonator boundary acoustic wave filter portions are connected in parallel with one another as described above. Instead, in FIG. 1, for example, the longitudinally coupled resonator boundary acoustic wave filter portions 130 and 160 may be omitted, and two longitudinally coupled resonator boundary acoustic wave filter portions may be respectively connected in parallel between the unbalanced terminal 101 and the first balanced terminal 102 and between the unbalanced terminal 101 and the second balanced terminal 103. The boundary acoustic wave filter device according to an alternative example of a preferred embodiment of the present invention, as described above, was manufactured and its filter characteristic was measured. The results are shown in FIG. 5.

FIG. 5 shows a filter characteristic when in the boundary acoustic wave filter device 100 of the preferred embodiment, the overlap width W is set to about 40 μm and W/P is set to about 25. On the other hand, the broken line shows a filter characteristic when in the alternative example, that is, in the boundary acoustic wave filter device having a two-element parallel structure, the overlap width W is set to about 60 μm and W/P is set to about 37.5. Note that the reason why W is set to about 60 μm in the alternative example is because the overlap width W is set to one and half times the W (=40 μm) in the three-element parallel structure.

As shown in FIG. 5, as compared to the two-element parallel structure, in the three-element parallel structure of the present preferred embodiment, it is possible to reduce the overlap width W of each electrode finger to thereby reduce a loss due to the resistance of the electrode finger. By doing so, it is possible to reduce an insertion loss. Thus, in a structure in which input ends of N (N is an integer greater than or equal to 3) longitudinally coupled resonator boundary acoustic wave filter portions are connected to the input terminal, N is preferably set to at least 3. By doing so, it is possible to further reduce an insertion loss.

In addition, the band-pass filter of a GSM 1900 MHz receiving band of a cellular phone is primarily used in a system in which an input impedance is about 50Ω and an output impedance is about 150Ω. In this case, when the boundary acoustic wave filter device 100 of this preferred embodiment is designed so that the metallization ratio of each IDT is set to about 0.5, W/P is about 17, for example. Note that the metallization ratio is a ratio of the size of the electrode fingers in the width direction in an IDT to the sum of the size of the electrode fingers in the width direction and gaps between the electrode fingers. That is, in order to be used in a 50-150Ω system, when the metallization ratio is set to about 0.5, in the three-element parallel structure boundary acoustic wave filter device 100 of this preferred embodiment, W/P is about 17. Thus, it is difficult to reduce an insertion loss. Therefore, when the three-element parallel structure is provided, in order to obtain W/P of about 22 or greater, the metallization ratio must be about 0.45 or less.

FIGS. 6A to 6C, FIGS. 7A to 7C, and FIGS. 8A to 8C are views that show filter characteristics of the longitudinally coupled resonator boundary acoustic wave filter device 100 when the thickness of each IDT and the metallization ratio are changed. The IDTs are made of Au. Here, where the density of a metal thin film that defines the IDTs is ρ (g/cm$^3$), the thickness is h (μm), and the interval of electrode fingers is P (μm), the product of the density of metal that defines the IDTs and normalized thickness ρ×h/P is used as a parameter. Note that p of Au is about 19.32 g/cm$^3$. Even when a metal having any density ρ is used, a substantially equivalent filter characteristic may be obtained if ρ×h/P is substantially the same.

Figure 6A:
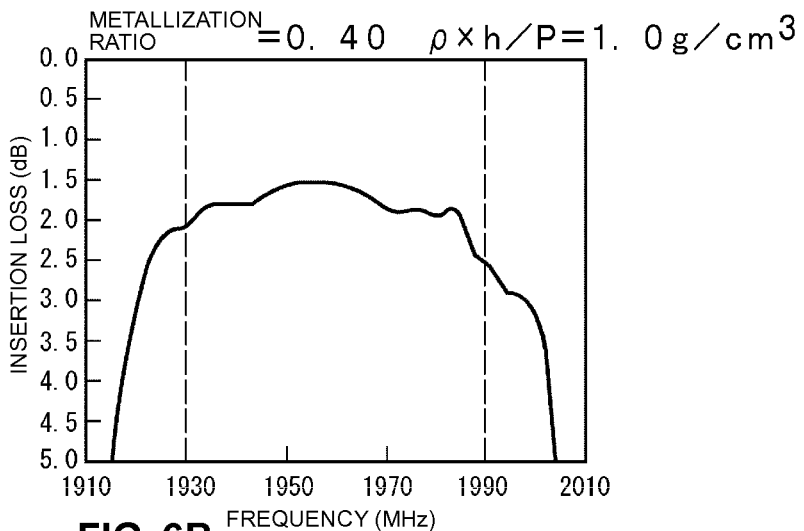
FIGS. 6A to 6C are views that show filter characteristics when the product of IDT density and normalized thickness ($\rho \times h/P$) is about 1.0 $g/cm^3$ and the metallization ratios are about 0.40, about 0.45 and about 0.5, respectively.
Figure 6B:
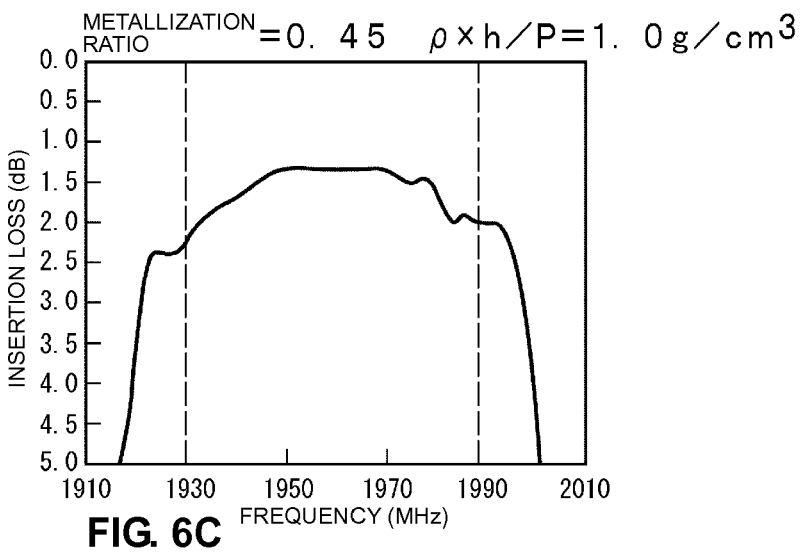
Figure 6C:
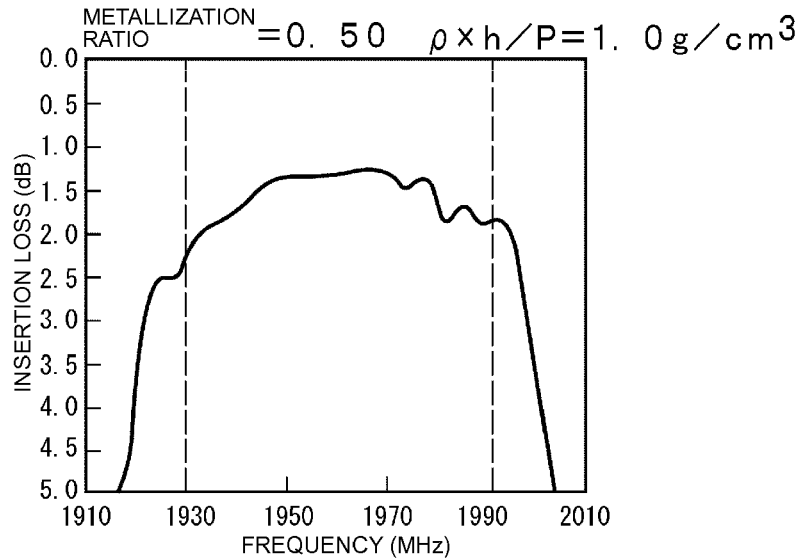

FIGS. 6A to 6C show the results when ρ×h/P is about 1.0 g/cm$^3$ and the metallization ratios are respectively about 0.40, about 0.45 and about 0.5.

When Au is formed to have ρ×h/P=about 1.0 g/cm$^3$, IDTs are made of Au having a thickness-wavelength ratio h/P=about =about 0.052.

Figure 7A:
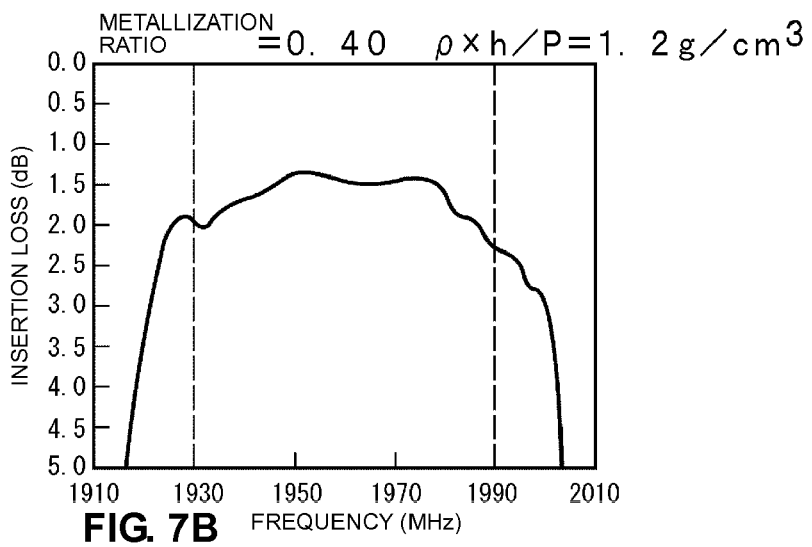
FIGS. 7A to 7C are views that show filter characteristics when the product of IDT density and normalized thickness ($\rho \times h/P$) is about 1.2 $g/cm^3$ and the metallization ratios are about 0.40, about 0.45 and about 0.5, respectively.
Figure 7B:
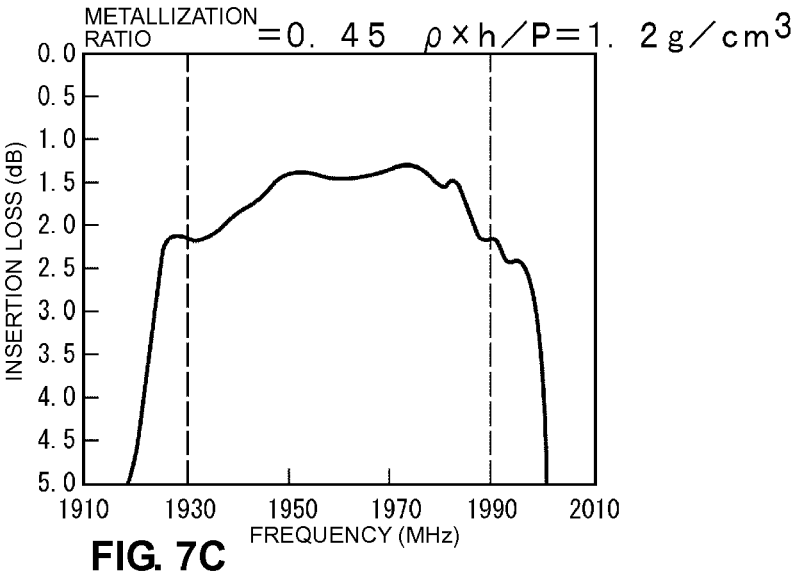
Figure 7C:
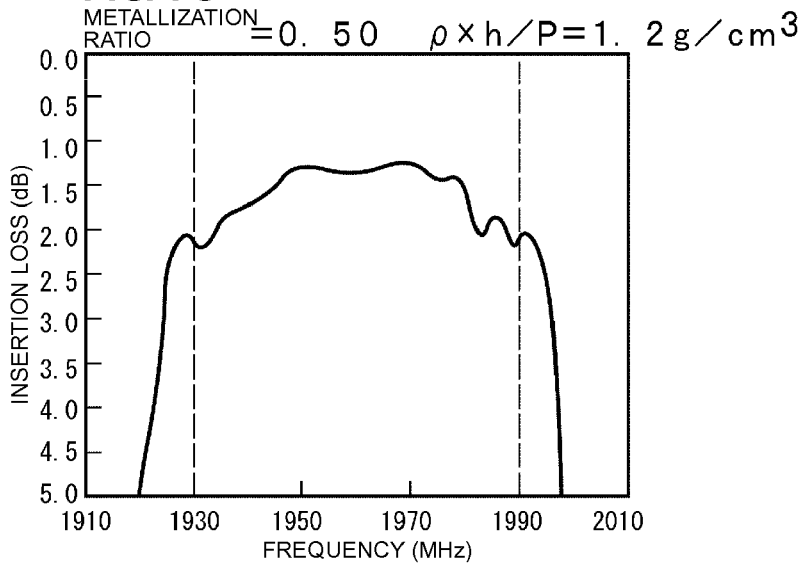

In addition, FIGS. 7A to 7C show the results when ρ×h/P is about 1.2 g/cm$^3$ and the metallization ratios are respectively about 0.40, about 0.45 and about 0.5.

Figure 8A:
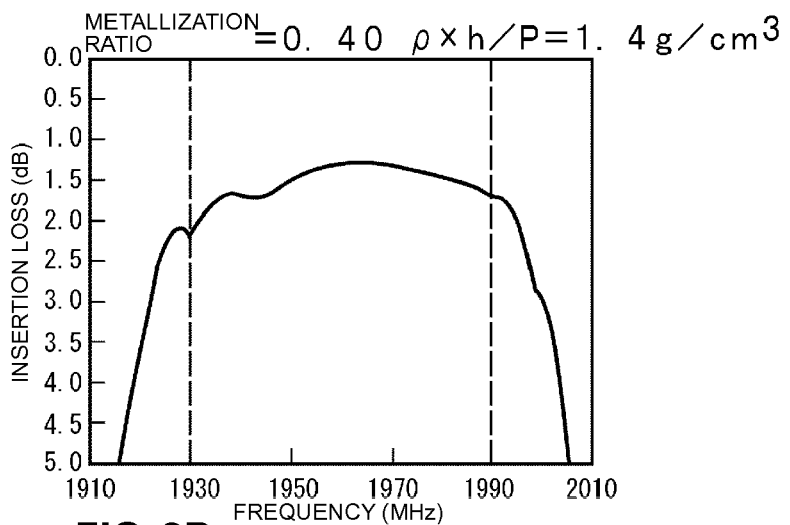
FIGS. 8A to 8C are views that show filter characteristics when the product of IDT density and normalized thickness ($\rho \times h/P$) is about 1.4 $g/cm^3$ and the metallization ratios are about 0.40, about 0.45 and about 0.5, respectively.
Figure 8B:
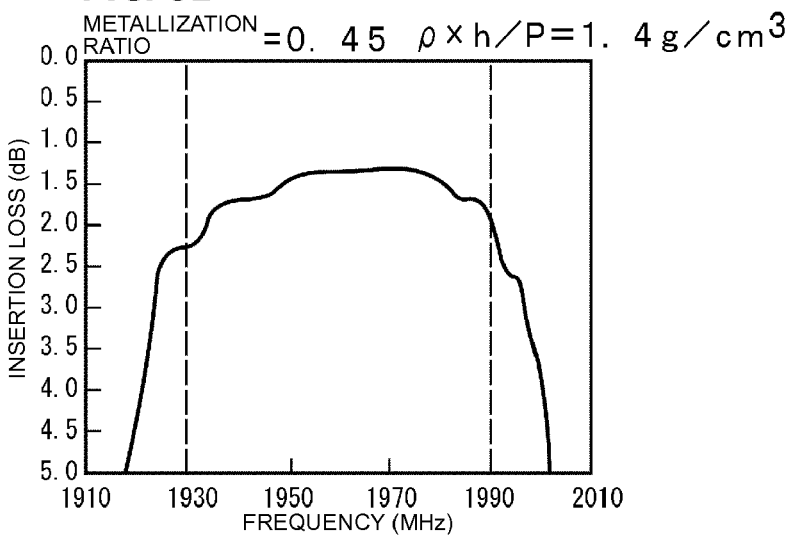
Figure 8C:
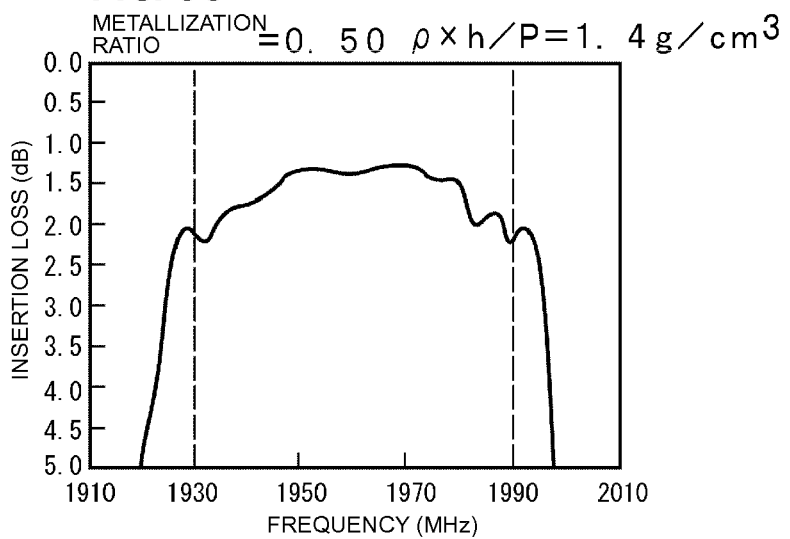

FIGS. 8A to 8C show the results when ρ×h/P is about 1.4 g/cm$^3$ and the metallization ratios are respectively about 0.40, about 0.45 and about 0.5.

As shown in FIGS. 6A to 8C, as the metallization ratio decreases, the insertion loss increases. However, when ρ×h/P is greater than or equal to about 1.2 g/cm$^3$, it appears that degradation of an insertion loss is very small when the metallization ratio is about 0.45 or less. Thus, in the three-element parallel structure longitudinally coupled resonator boundary acoustic wave filter device, it is preferable that the metallization ratio is about 0.45 or less and ρ×h/P is at least about 1.2 g/cm$^3$. By doing so, it appears that an insertion loss may be further reduced.

Note that in FIGS. 6A to 8C, the characteristics when the metallization ratio is at least about 0.4 are shown. However, the metallization ratio may be less than about 0.4 and, in that case as well, it is possible to obtain favorable filter characteristics having a small ripple. Note that the lower limit of the metallization ratio is not specifically limited in order to achieve the advantages of the invention. However, because machining accuracy for electrodes is limited, the lower limit will be determined based on the machining accuracy for electrodes.

Figure 9:
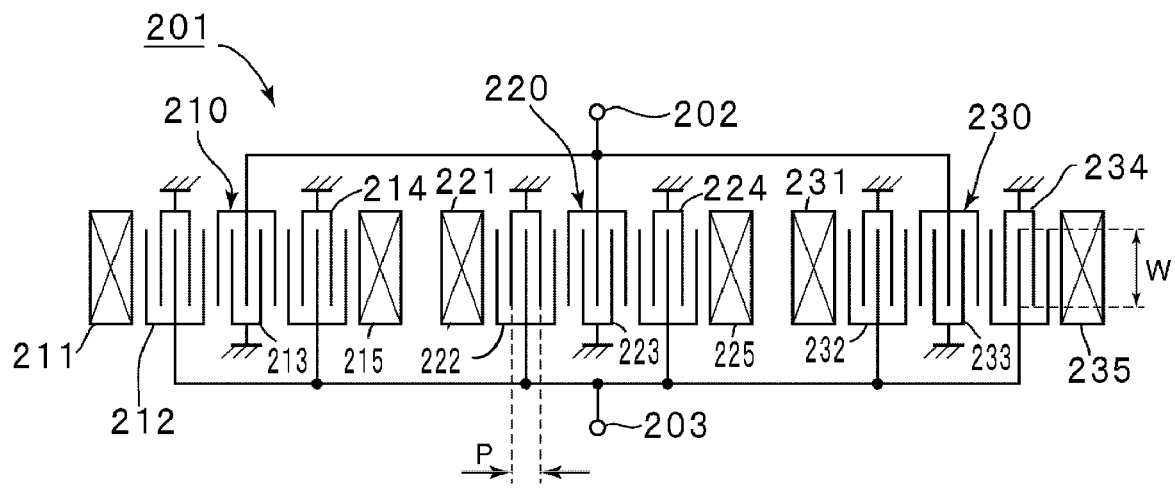
FIG. 9 is a schematic plan view that shows the electrode structure of a boundary acoustic wave filter device according to a second preferred embodiment of the present invention.
Figure 10:
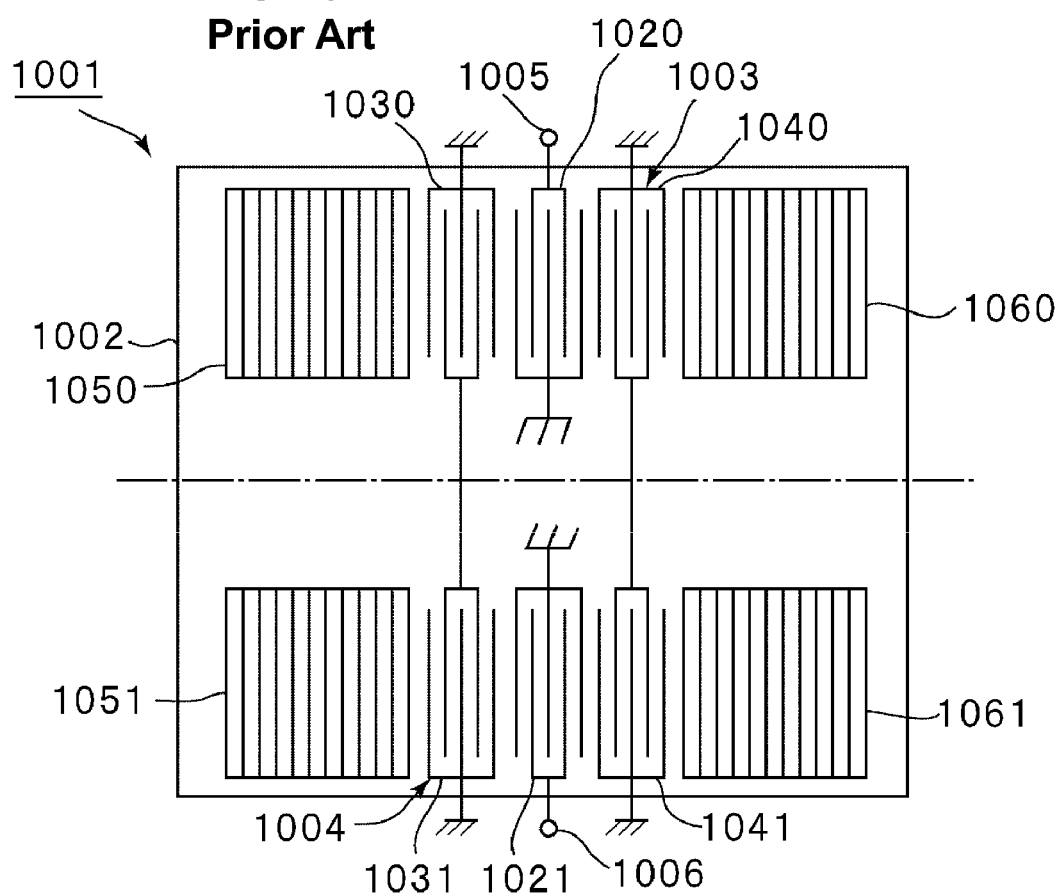
FIG. 10 is a plan view that shows a known surface acoustic wave filter device.
Figure 11:
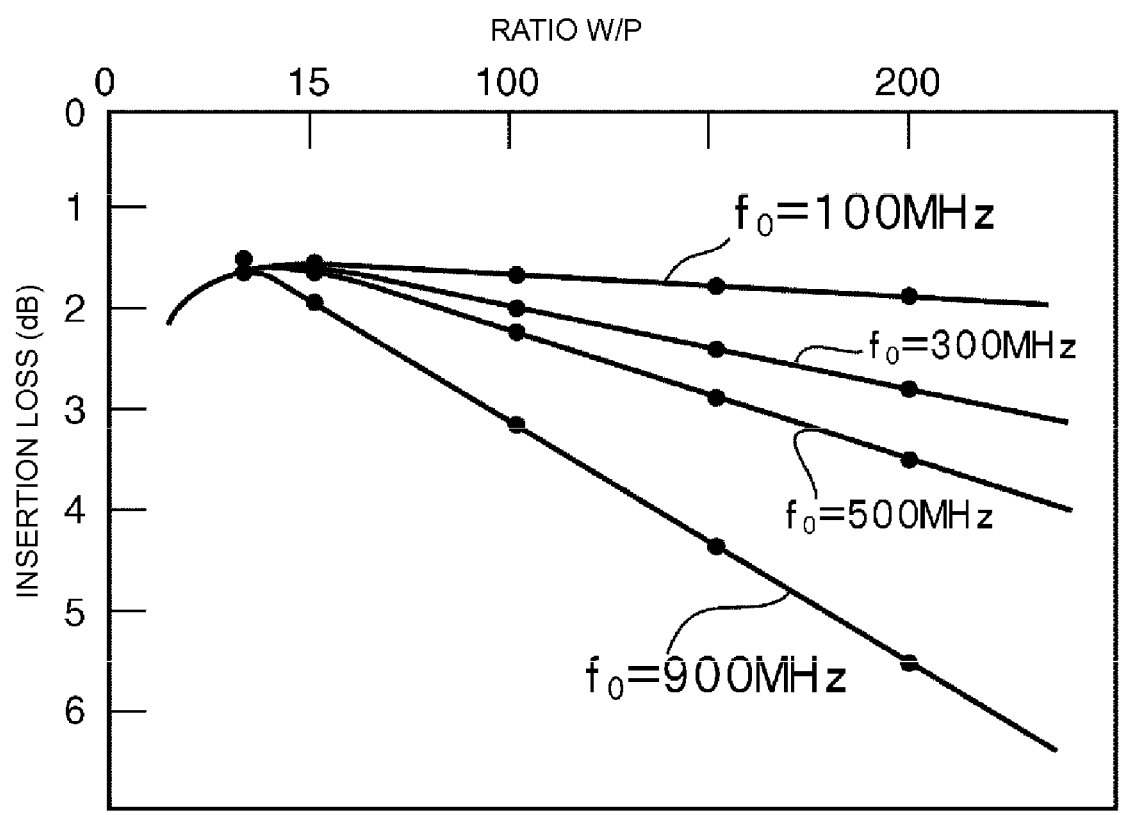
FIG. 11 is a view that shows the relationship between a ratio W/P and an insertion loss in the known surface acoustic wave filter device shown in FIG. 10.

In the boundary acoustic wave filter device 100 shown in FIG. 1 and the above-described alternative example, the boundary acoustic wave filter device having a balance-unbalance converter function is described. However, preferred embodiments of the present invention are not limited to boundary acoustic wave filter devices having a balance-unbalance converter function. FIG. 9 is a schematic plan view that shows the electrode structure of a boundary acoustic wave filter device according to a second preferred embodiment which does not include a balance-unbalance converter function.

In the boundary acoustic wave filter device 201, the electrode structure shown in the FIG. 9 is arranged between an input terminal 202 and an output terminal 203. One end of each of the middle first IDTs 213, 223 and 233 of first to third longitudinally coupled resonator boundary acoustic wave filter portions 210, 220 and 230 are connected to the input terminal 202. The other ends of the IDTs 213, 223 and 233 are connected to a ground.

Second and third IDTs 212, 214, 222, 224, 232 and 234 are arranged respectively on both side of the first IDTs 213, and 233 in the boundary wave propagating direction. One end of each of the second and third IDTs 212, 214, 222, 224, 232 and 234 are connected to a ground, and the other ends are connected in common to the output terminal 203.

The longitudinally coupled resonator boundary acoustic wave filter portions 210, 220 and 230 are each a three-IDT type longitudinally coupled resonator boundary acoustic wave filter, as in the above-described first longitudinally coupled resonator boundary acoustic wave filter portion 110. The longitudinally coupled resonator boundary acoustic wave filter portions 210, and 230 respectively include pairs of reflectors 211 and 215, and 225, and 231 and 235, which are arranged respectively on both sides of the regions in which the first to third IDTs are provided in the boundary wave propagating direction.

In the boundary acoustic wave filter device 201 of the present preferred embodiment, where the overlap width of each IDT is W and the interval of electrode fingers is P, and W/P is preferably in a range of about 20 to about 45, and more preferably, in a range of about 22 to about 32, it is possible to reduce an insertion loss.

In addition, in the present preferred embodiment, by setting the product of the density of metal that defines IDTs and normalized thickness ρ×h/P to at least about 1.2 g/cm³, it is possible to further reduce an insertion loss.

Note that in FIG. 9, the three longitudinally coupled resonator boundary acoustic wave filter portions 210, 220 and 230 are connected in parallel between the input terminal 202 and the output terminal 203. However, two longitudinally coupled resonator boundary acoustic wave filter portions may be connected in parallel between the input terminal and the output terminal.

Note that in the above-described experimental examples, the IDTs are made of Au. However, a metal that defines the IDTs is not specifically limited. Instead, IDTs may preferably be made of another metal, such as Cu, Pd or Ag, for example, or may be made of an alloy that primarily includes these metals, such as Ag—Pd, for example. In addition, the IDTs may be made of a metal laminated film that is formed by laminating a plurality of metal layers.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave filter device comprising:
a piezoelectric substrate made of $LiNbO_3$ having a principal plane obtained by rotating the Y-axis through about 15 degrees +−10 degrees;
a dielectric substrate made of silicon oxide and laminated on the piezoelectric substrate; and
an electrode structure arranged at a boundary between the piezoelectric substrate and the dielectric substrate; wherein
the boundary acoustic wave filter device utilizes a boundary acoustic wave that propagates along the boundary;
the electrode structure defines a longitudinally coupled resonator boundary acoustic wave filter portion that includes a plurality of IDTs arranged in a boundary acoustic wave propagating direction in which the boundary acoustic wave propagates, and a pair of reflectors arranged respectively on both sides of a region in which the plurality of IDTs are provided in the boundary acoustic wave propagating direction;
in each of the plurality of IDTs, the overlap width of electrode fingers is W and the interval of electrode fingers is P, and a ratio of W/P is in a range of about 20 to about 45; and
each IDT is defined by a metal thin film, a metallization ratio of each IDT is about 0.45 or less, and where the density of the metal thin film is ρ (g/cm³), the thickness of an electrode is h (μm) and the interval of electrode fingers is P (μm), ρ×h/P is greater than or equal to about 1.2 (g/cm³).

2. The boundary acoustic wave filter device according to claim 1, wherein the ratio W/P is in a range of about 22 to about 32.

3. A boundary acoustic wave filter device comprising:
a piezoelectric substrate made of $LiNbO_3$ having a principal plane obtained by rotating the Y-axis through about 15 degrees +−10 degrees;
a dielectric substrate made of silicon oxide and laminated on the piezoelectric substrate; and
an electrode structure arranged at a boundary between the piezoelectric substrate and the dielectric substrate; wherein
the electrode structure defines N longitudinally coupled resonator boundary acoustic wave filter portions, where N is an integer greater than or equal to 3, each of which includes at least three IDTs arranged in a boundary acoustic wave propagating direction in which the boundary acoustic wave propagates, and a pair of reflectors arranged respectively on both sides of a region in which the at least three IDTs are provided in the boundary acoustic wave propagating direction;
the electrode structure further includes an input terminal and an output terminal, input ends of the N longitudinally coupled resonator boundary acoustic wave filter portions are connected to the input terminal, and in each of the IDTs, the overlap width of electrode fingers is W and the interval of electrode fingers is P, and a ratio W/P is in a range of about 20 to about 45; and
each IDT is defined by a metal thin film, a metallization ratio of each IDT is about 0.45 or less, and where the density of the metal thin film is ρ (g/cm³), the thickness of an electrode is h (μm) and the interval of electrode fingers is P (μm), ρ×h/P is greater than or equal to about 1.2 (g/cm³).

4. The boundary acoustic wave filter device according to claim 3, wherein the ratio W/P is in a range of about 22 to about 32.

5. A boundary acoustic wave filter device comprising:
a piezoelectric substrate made of $LiNbO_3$ having a principal plane obtained by rotating the Y-axis through about 15 degrees +−10 degrees;
a dielectric substrate made of silicon oxide and laminated on the piezoelectric substrate; and
an electrode structure arranged at a boundary between the piezoelectric substrate and the dielectric substrate; wherein
the boundary acoustic wave filter device utilizes a boundary acoustic wave that propagates along the boundary;
the electrode structure defines first, second, third, fourth, fifth, and sixth longitudinally coupled resonator boundary acoustic wave filter portions, each of which includes first, second, and third IDTs arranged in the boundary acoustic wave propagating direction in which the boundary acoustic wave propagates;
the electrode structure includes an unbalanced terminal to which input ends of the first, second, third, fourth, fifth, and sixth longitudinally coupled resonator boundary acoustic wave filter portions are connected, a first balanced terminal to which output ends of the first, second, and third longitudinally coupled resonator boundary acoustic wave filter portions are connected, and a second balanced terminal to which output ends of the fourth, fifth, and sixth longitudinally coupled resonator boundary acoustic wave filter portions are connected;

a phase of a first output signal to an input signal is substantially the same in each of the first, second, and third longitudinally coupled resonator boundary acoustic wave filter portions, and a phase of a second output signal to the input signal is substantially the same in each of the fourth, fifth, and sixth longitudinally coupled resonator boundary acoustic wave filter portions;

the phase of the first output signal to the input signal in each of the first, second, and third longitudinally coupled resonator boundary acoustic wave filter portions is different by about 180 degrees from the phase of the second output signal to the input signal in each of the fourth, fifth, and sixth longitudinally coupled resonator boundary acoustic wave filter portions; and in each of the IDTs, the overlap width of electrode fingers is W and the interval of electrode fingers is P, and a ratio W/P is in a range of about 20 to about 45.

6. The boundary acoustic wave filter device according to claim 5, wherein the ratio W/P is in a range of about 22 to about 32.

7. The boundary acoustic wave filter device according to claim 5, wherein each IDT is defined by a metal thin film, a metallization ratio of each IDT is about 0.45 or less, and where the density of the metal thin film is $\rho$ (g/cm$^3$), the thickness of an electrode is h ($\mu$m) and the interval of electrode fingers is P ($\mu$m), $\rho \times h/P$ is greater than or equal to about 1.2 (g/cm$^3$).

* * * * *